US011522050B2

United States Patent
Hsieh et al.

(10) Patent No.: US 11,522,050 B2
(45) Date of Patent: Dec. 6, 2022

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Jui Fu Hsieh, Zhubei (TW); Chih-Teng Liao, Hsinchu (TW); Chih-Shan Chen, New Taipei (TW); Yi-Jen Chen, Hsinchu (TW); Tzu-Chan Weng, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 41 days.

(21) Appl. No.: 17/104,938

(22) Filed: Nov. 25, 2020

(65) Prior Publication Data

US 2021/0242309 A1 Aug. 5, 2021

Related U.S. Application Data

(60) Provisional application No. 62/967,987, filed on Jan. 30, 2020.

(51) Int. Cl.
*H01L 29/08* (2006.01)
*H01L 29/78* (2006.01)
*H01L 29/66* (2006.01)
*H01L 21/3213* (2006.01)
(Continued)

(52) U.S. Cl.
CPC .... *H01L 29/0847* (2013.01); *H01L 21/32136* (2013.01); *H01L 21/823814* (2013.01);
(Continued)

(58) Field of Classification Search
CPC .......... H01L 29/0847; H01L 21/32136; H01L 21/823814; H01L 21/823821;
(Continued)

(56) References Cited

U.S. PATENT DOCUMENTS 7,648,915 B2    1/2010  Lindholm et al.
8,962,400 B2    2/2015  Tsai et al.
(Continued)

FOREIGN PATENT DOCUMENTS

TW          201703134 A      1/2017

*Primary Examiner* — Karen Kusumakar
*Assistant Examiner* — Adam S Bowen
(74) *Attorney, Agent, or Firm* — McDermott Will & Emery LLP

(57) ABSTRACT

In a method of manufacturing a semiconductor device including a Fin FET, a fin structure extending in a first direction is formed over a substrate. An isolation insulating layer is formed over the substrate so that an upper portion of the fin structure is exposed from the isolation insulating layer. A gate structure extending in a second direction crossing the first direction is formed over a part of the fin structure. A fin mask layer is formed on sidewalls of a source/drain region of the fin structure. The source/drain region of the fin structure is recessed by a plasma etching process. An epitaxial source/drain structure is formed over the recessed fin structure. In the recessing the source/drain region of the fin structure, the plasma etching process comprises applying pulsed bias voltage and RF voltage with pulsed power.

20 Claims, 18 Drawing Sheets

(51) Int. Cl.
    *H01L 21/8238*    (2006.01)
    *H01L 27/092*    (2006.01)

(52) U.S. Cl.
    CPC .. *H01L 21/823821* (2013.01); *H01L 27/0924* (2013.01); *H01L 29/66795* (2013.01); *H01L 29/785* (2013.01)

(58) Field of Classification Search
    CPC ........... H01L 27/0924; H01L 29/66795; H01L 29/785; H01L 29/665; H01L 29/66545; H01L 21/823418; H01L 21/3065; H01L 21/823431; H01L 29/66636
See application file for complete search history.

(56) References Cited

U.S. PATENT DOCUMENTS

| | | |
|---|---|---|
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 2006/0138398 A1* | 6/2006 | Shimamune .......... H01L 29/518 257/E21.431 |
| 2008/0197110 A1* | 8/2008 | Kim .................. H01J 37/32009 257/E21.252 |
| 2011/0281438 A1* | 11/2011 | Lee .................. H01L 21/32136 438/720 |
| 2015/0187943 A1* | 7/2015 | Lee .................. H01L 21/02579 257/192 |
| 2016/0086857 A1 | 3/2016 | Zhang et al. |
| 2017/0256456 A1* | 9/2017 | Lee .................... H01L 29/7848 |
| 2019/0006587 A1* | 1/2019 | Gilchrist ............ H01L 45/1233 |
| 2019/0386118 A1 | 12/2019 | Chan et al. |

\* cited by examiner

| Condition | RF Pulse Duty Ratio (state1) | S/D profile | H1:H2 (nm) | H1/H2 Ratio | EPI profile | G1:G2 (nm) | G1:G2 Ratio | C1 (nm) |
|---|---|---|---|---|---|---|---|---|
| 1 | 10~30% | | 56.1:47.4 | 1.15~1.27 | | 51.5:43.8 | 1.14~1.25 | -5.2~-3.5 |
| 2 | 40~60% | | 57.8:54.9 | 1.02~1.13 | | 55.4:52.1 | 1.03~1.12 | -3~-0.5 |
| 3 | 70~90% | | 56.4:59.3 | 0.85~0.95 | | 60.8:59.7 | 0.92~1.01 | 0.3~5 |

METHOD OF MANUFACTURING A SEMICONDUCTOR DEVICE AND A SEMICONDUCTOR DEVICE

RELATED APPLICATION

This application claims priority to U.S. Provisional Patent Application No. 62/967,987 filed Jan. 30, 2020, the entire contents of which are incorporated herein by reference.

BACKGROUND

The disclosure relates to a semiconductor integrated circuit, and more particularly to a semiconductor device having an epitaxial source/drain (S/D) structure with voids and its manufacturing process. As the semiconductor industry has progressed into nanometer technology process nodes in pursuit of higher device density, higher performance, and lower costs, challenges from both fabrication and design issues have resulted in the development of three-dimensional designs, such as a fin field effect transistor/Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 10A, 10B, 10C and 10D show cross sectional views of one of the various stages of a manufacturing operation for a semiconductor device according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B. A and C, B and C, or A. B and C), and does not mean one element from A, one element from B and one element from C, unless otherwise described Materials, configurations, dimensions, processes and/or operations same as or similar to those described with one embodiment may be employed in the other embodiments and the detailed explanation may be omitted.

Disclosed embodiments relate to a semiconductor device and its manufacturing method, in particular, source/drain regions of a field effect transistor (FET). The embodiments such as those disclosed herein are generally applicable not only to FinFETs but also other FETs.

Figure 1:
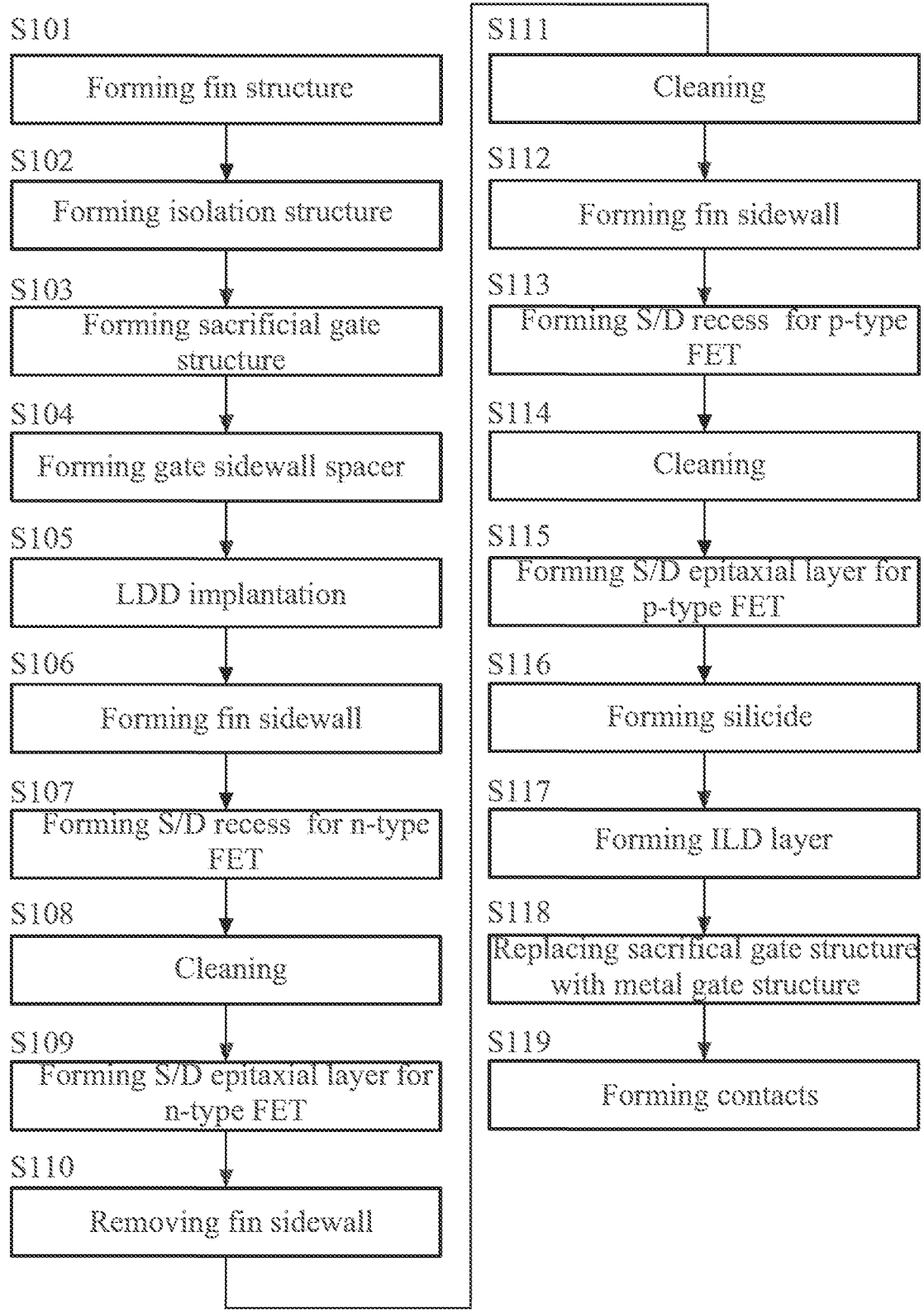
FIG. 1 shows a process flow chart of a manufacturing operation for a semiconductor device according to an embodiment of the present disclosure.

FIG. 1 shows process a flow chart and FIGS. 2-18 show cross sectional views of various stages for manufacturing a semiconductor device according to embodiments of the present disclosure. It is understood that additional operations can be provided before, during, and after processes shown by FIGS. 1 and 2-18, and some of the operations described below can be replaced or eliminated, for additional embodiments of the method. The order of the operations/processes may be interchangeable.

Figure 2:
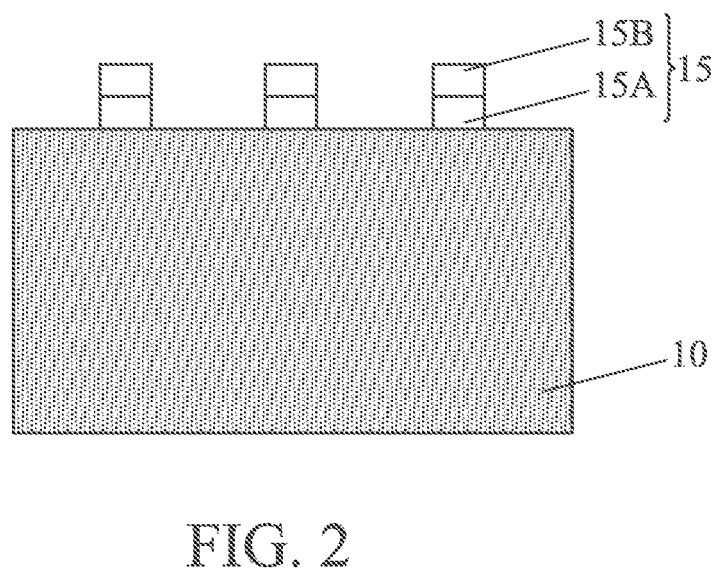
FIG. 2 shows a cross sectional view of one of the various stages of a manufacturing operation for a semiconductor device according to an embodiment of the present disclosure.
Figure 3:
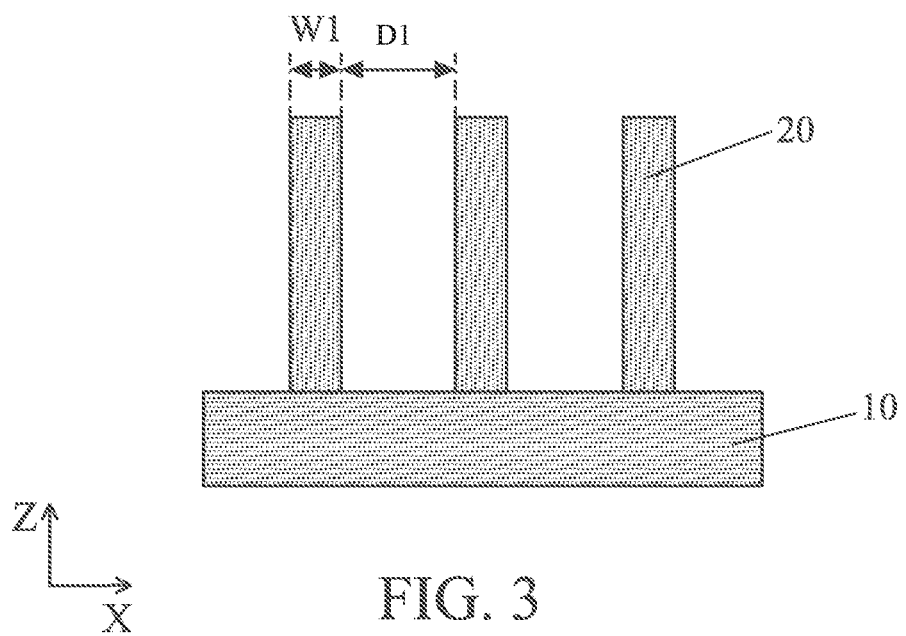
FIG. 3 shows a cross sectional view of one of the various stages of a manufacturing operation for a semiconductor device according to an embodiment of the present disclosure.

In S101 of FIG. 1 and as shown in FIGS. 2 and 3, one or more fin structures are formed over a substrate 10. Fin structures for FinFETs can be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process Spacers are formed alongside the patterned sacrificial layer using a self-aligned process. The sacrificial layer is then removed, and the remaining spacers, or mandrels, may then be used to pattern the fin structures. The multi-patterning processes combining photolithography and self-aligned processes generally result in forming a pair of fin structures.

In some embodiments, a mask layer 15 is formed over a substrate 10 to fabricate fin structures. The mask layer 15 is formed by, for example, a thermal oxidation process and/or a chemical vapor deposition (CVD) process. The substrate 10 is, for example, a p-type silicon or germanium substrate with an impurity concentration in a range from about $1 \times 10^{15}$ $cm^{-3}$ to about $1 \times 10^{16}$ $cm^{-3}$. In other embodiments, the substrate is an n-type silicon or germanium substrate with an impurity concentration in a range from about $1 \times 10^{15}$ $cm^{-3}$ to about $1 \times 10^{16}$ $cm^{-3}$.

Alternatively, the substrate 10 may comprise another elementary semiconductor, such as germanium, a compound semiconductor including Group IV-IV compound semiconductors such as SiC and SiGe, Group II I-V compound semiconductors such as GaAs, GaP, GaN, InP, InAs, InSb, GaAsP, AlGaN, AlInAs, AlGaAs, GaInAs, GaInP, and/or GaInAsP; or combinations thereof, in one embodiment, the substrate 10 is a silicon layer of an SOI (silicon-on insulator) substrate. When an SOI substrate is used, the fin structure may protrude from the silicon layer of the SOI substrate or may protrude front the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments. The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments A mask pattern is further formed over the mask layer. The mask pattern is, for example, a resist pattern formed by lithography operations.

By using the mask pattern as an etching mask, a hard mask pattern 15 of the pad oxide layer and the silicon nitride mask layer is formed, as shown in FIG. 2.

Then, as shown in FIG. 3, by using the hard mask pattern 15 as an etching mask, the substrate 10 is patterned into fin structures 20 by trench etching using a dry etching method and/or a wet etching method.

In FIG. 3, three fin structures 20 are disposed over the substrate 10. However, the number of the fin structures is not limited to three. The numbers may be as small as one or more than three. In some embodiments, the number of fin structures is in a range from 5 to 1000, which are connected by a source/drain epitaxial layer formed in subsequent operations. In other embodiments, the number of fin structures is in a range from 5 to 100, which are connected by source/drain epitaxial layers formed in subsequent operations. In certain embodiments, the number of fin structures is in a range from 5 to 20, which are connected by source/drain epitaxial layers formed in subsequent operations. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 12 nm in other embodiments. The space D1 between two fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the sacrificial gate structure 40 (see, FIG. 6A) may be referred to as a well region, and the upper part of the fin structure 20 may be referred to as a channel region Under the sacrificial gate structure 40, the well region is embedded in the isolation insulating layer 30 (see, FIG. 6A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 4:
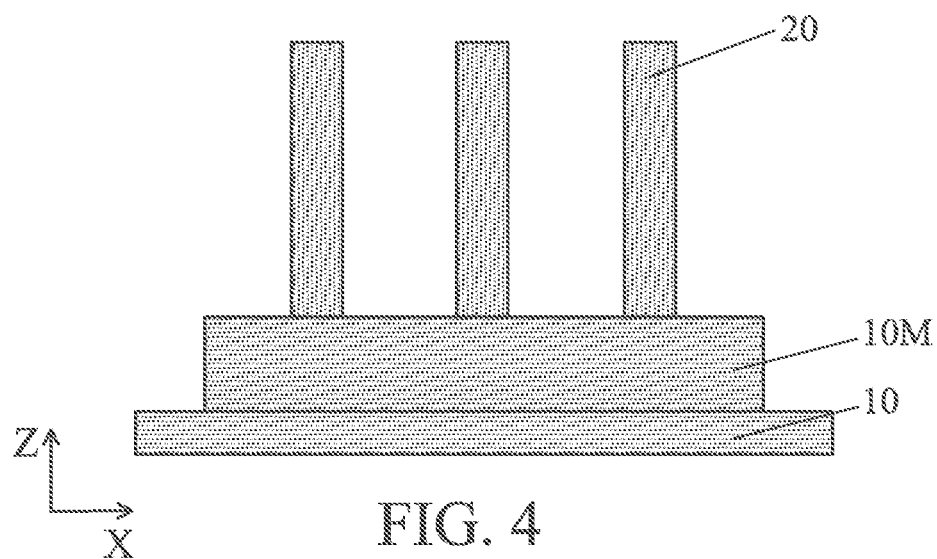
FIG. 4 shows a cross sectional view of one of the various stages of a manufacturing operation for a semiconductor device according to an embodiment of the present disclosure.

After the fin structures 20 are formed, the substrate 10 is further etched to form a mesa shape 10M in some embodiments, as shown in FIG. 4. In other embodiments, the mesa shape 10M is first formed, and then the fin structures 20 are formed. In certain embodiments, no mesa shape is formed.

After the fin structures 20 and the mesa shape 10M are formed, at S102 of FIG. 1, an isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio Usually, various chemistries are added to silicon-containing precursors to allow the deposited film to flow. In some embodiments, nitrogen hydride bonds are added Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA) These flowable silicon oxide materials are formed in a multiple-operation process. After the flowable film is deposited, it is cured and then annealed to remove un-desired element(s) to form silicon oxide. When the un-desired element(s) is removed, the flowable film densities and shrinks. In some embodiments, multiple anneal processes are conducted. The flowable film is cured and annealed more than once. The flowable film may be doped with boron and/or phosphorous.

Figure 5:
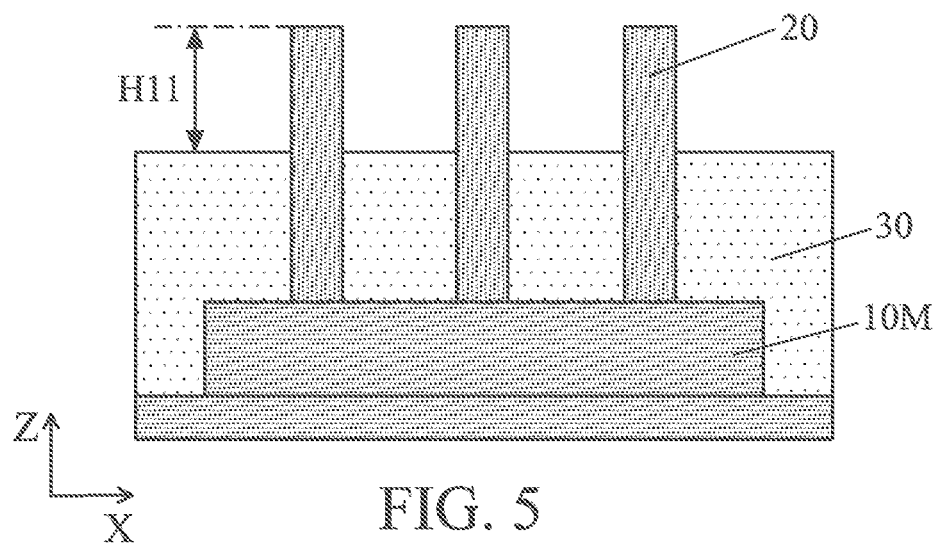
FIG. 5 shows a cross sectional view of one of the various stages of a manufacturing operation for a semiconductor device according to an embodiment of the present disclosure.

The isolation insulating layer 30 is first formed in a thick layer so that the fin structures are embedded in the thick layer, and the thick layer is recessed so as to expose the upper portions of the fin structures 20 as shown in FIG. 5. The height H11 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 6A:
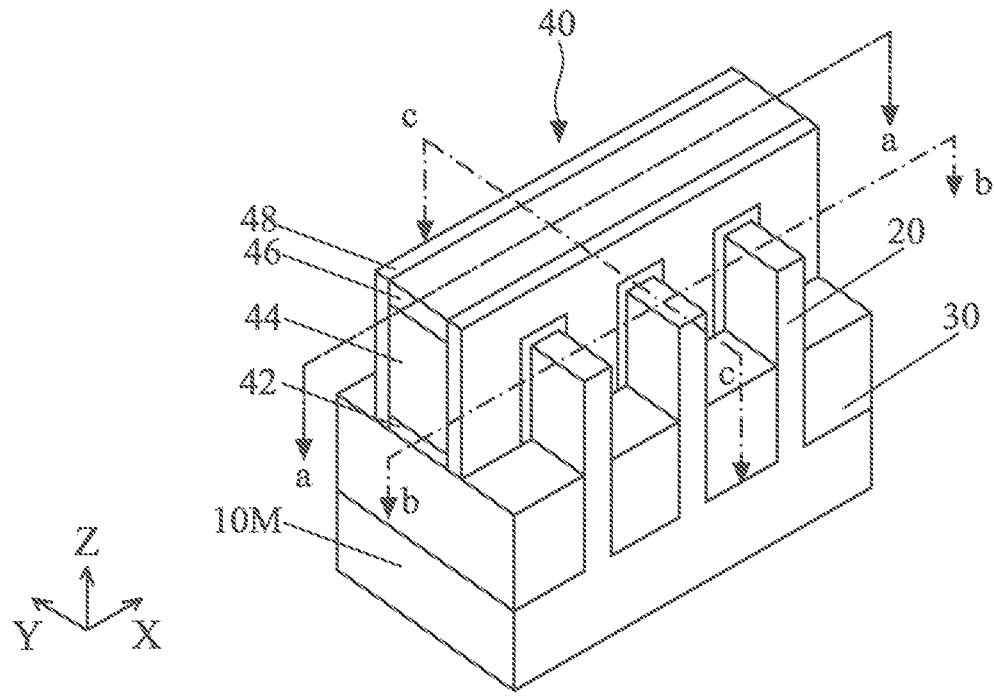
FIGS. 6A, 6B and 6C show views of one of the various stages of a manufacturing operation for a semiconductor device according to an embodiment of the present disclosure.
Figure 6B:
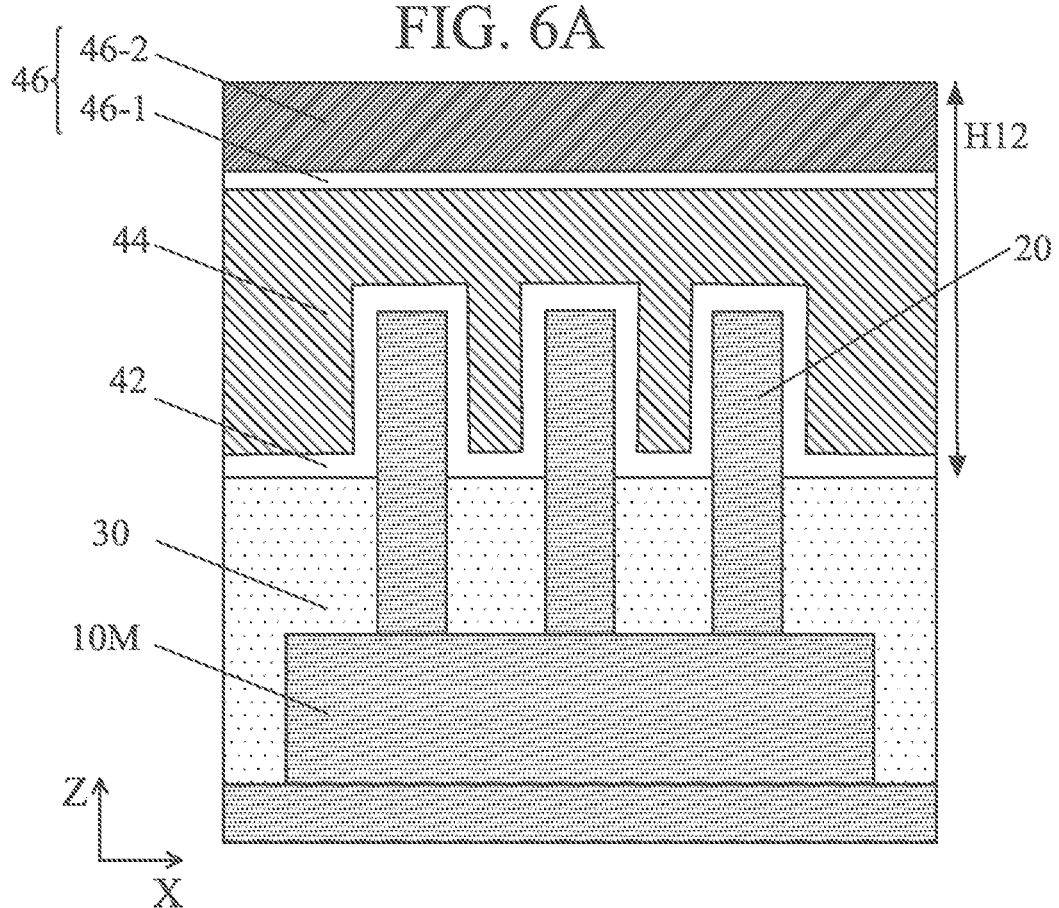
Figure 6C:
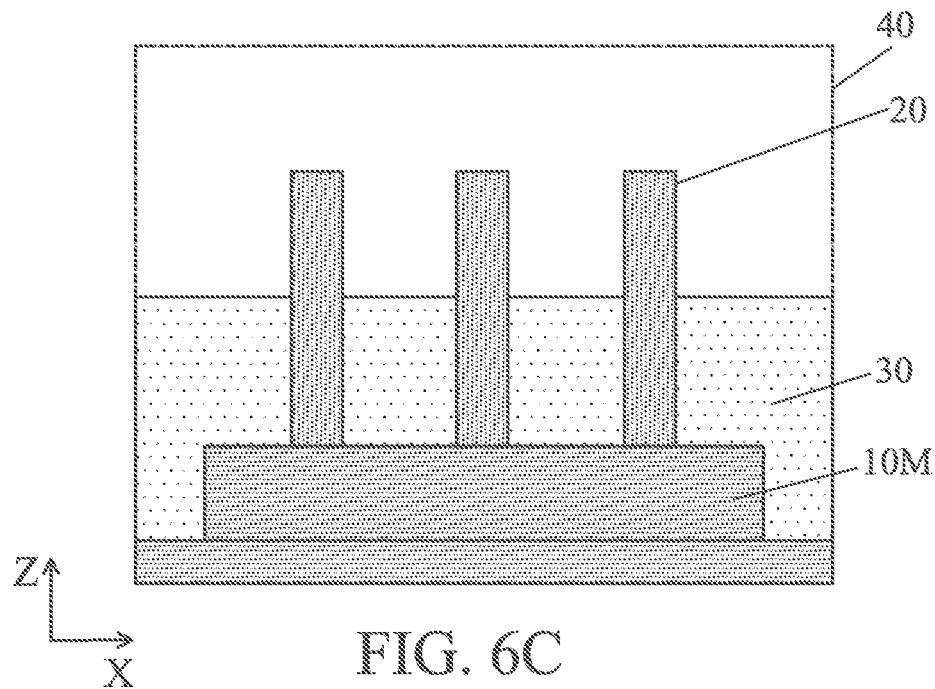

After the isolation insulating layer 30 is formed, at S103 of FIG. 1, a sacrificial gate structure 40 is formed over the fin structures 20, as shown in FIGS. 6A-6C. FIG. 6A is an exemplary perspective view, FIG. 6B is an exemplary cross sectional view along line a-a of FIG. 6A and FIG. 6C is an exemplary cross sectional view along line b-b of FIG. 6A. FIGS. 7, 8A, 10A and 11-20 are also cross sectional views along line b-b of FIG. 6A. FIGS. 8B and 10B are cross sectional views along line c-c of FIG. 6A.

As shown in FIG. 6A, the sacrificial gate structure 40 extends in the X direction, while the fin structures 20 extend in the Y direction.

To fabricate the sacrificial gate structure 40, a dielectric layer and a poly silicon layer are formed over the isolation insulating layer 30 and the exposed fin structures 20, and then patterning operations are performed so as to obtain sacrificial gate structures including a sacrificial gate pattern 44 made of poly silicon and a sacrificial dielectric layer 42. In some embodiments, the polysilicon layer is patterned by using a hard mask and the hard mask remains on the gate pattern 44 as a hard mask layer 46. The hard mask layer 46 includes one or more layers of insulating material. The hard mask layer 46 includes a silicon oxide layer 46-2 formed over a silicon nitride layer 46-1 in some embodiments. In other embodiments, the hard mask layer 46 includes a silicon nitride layer formed over a silicon oxide layer. The insulating material for the hard mask layer 46 may be formed by CVD, PVD, ALD, e-beam evaporation, or other suitable process. In some embodiments, the sacrificial dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The height H12 of the sacrificial gate structures is in a range from about 50 nm to about 400 nm in some embodiments, and is in a range from about 100 nm to 200 nm in other embodiments.

Further, at S104 of FIG. 1, gate sidewall spacers 48 are formed on both sidewalls of the sacrificial gate pattern. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material with or without post anisotropic etching. In one embodiment, the sidewall spacer layers are made of silicon nitride based material, such as SiN, SiON, SiOCN or SiCN.

In some embodiments, at S105 of FIG. 1, one or more ion implantation operations are performed to implant ions into the source/drain region of the fin structure, before and/or after the gate sidewall spacers 48, to form a lightly doped drain (LDD) structure.

Figure 7:
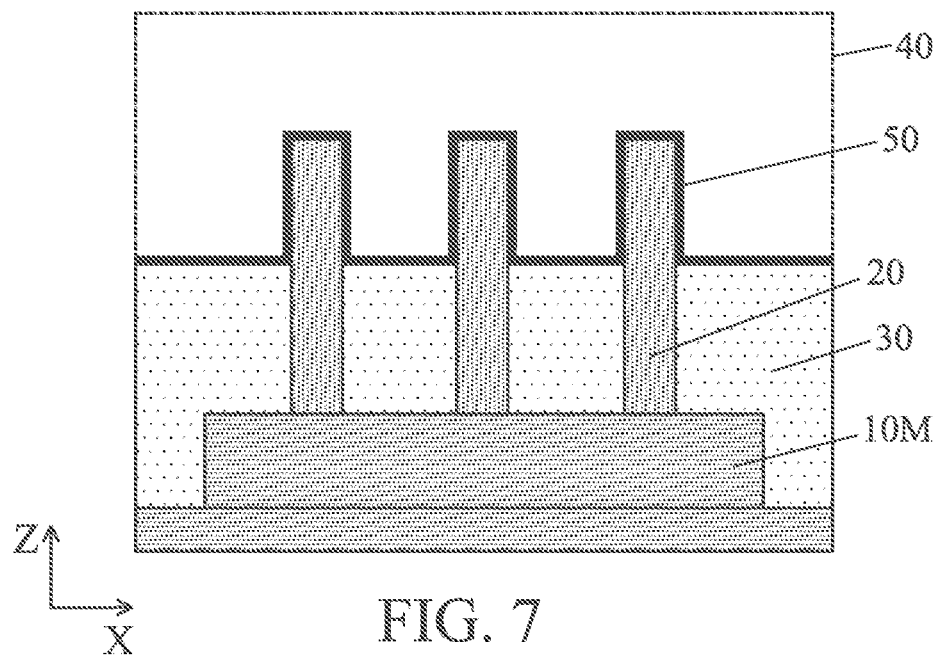
FIG. 7 shows a cross sectional view of one of the various stages of a manufacturing operation for a semiconductor device according to an embodiment of the present disclosure.

Then, as shown in FIG. 7, at S106 of FIG. 1, a fin mask layer 50 (fin sidewall) is formed over the fin structures 20. The fin mask layer 50 is made of dielectric material including silicon nitride based material, such as SiN, SiON, SiOCN or SiCN. In one embodiment, SiN is used as the fin mask layer 50. The fin mask layer 50 is formed by CVD, PVD, ALD, e-beam evaporation, or other suitable process. The thickness of the fin mask layer 50 is in a range from about 3 nm to about 30 nm in some embodiments.

In some embodiments, the fin mask layer 50 and the sidewall spacers 48 for the gate structure are separately formed. In other embodiments, the same blanket layer is used for the fin mask layer 50 and the sidewall spacers 48.

Figure 8A:
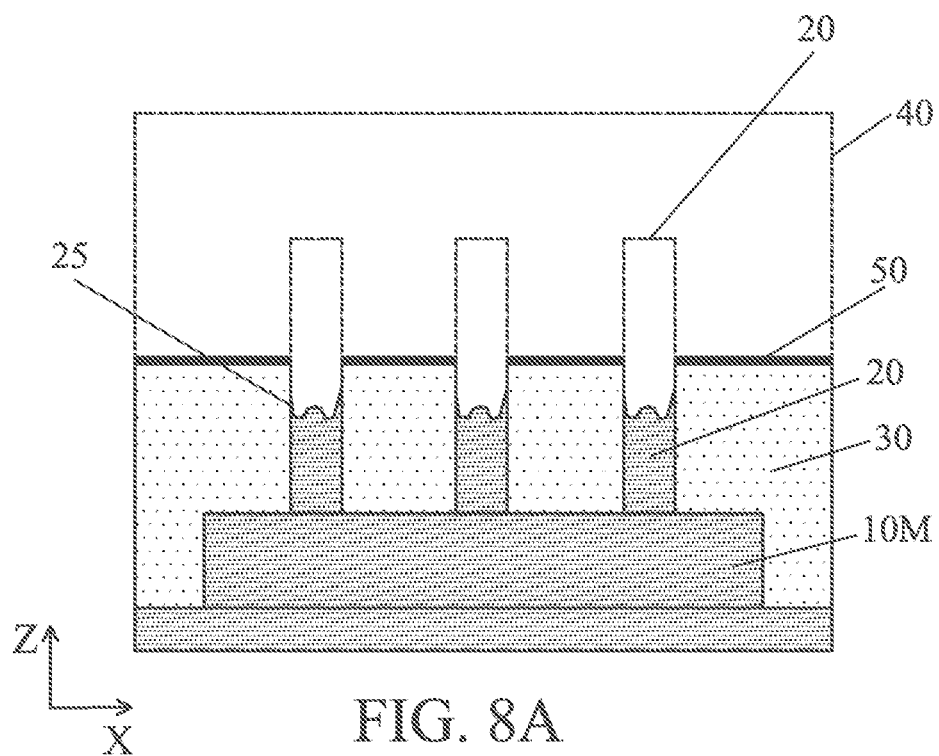
FIGS. 8A, 8B and 8C show cross sectional views of one of the various stages of a manufacturing operation for a semiconductor device according to an embodiment of the present disclosure.
Figure 8B:
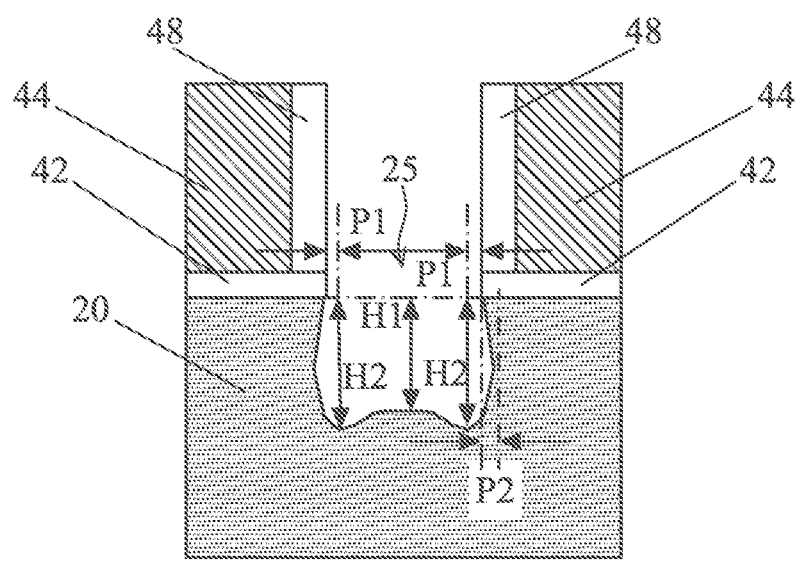

After forming the fin mask layer 50, at S107 of FIG. 1, the upper portion of the fin structures 20 are recessed and a part of the fin mask layer 50 disposed on side surfaces and the top surface of the fin structures protruding from the isolation insulating layer are removed by a dry etching and/or a wet etching operation. The upper portion of the fin structures 20 are recessed (etched) down to the level equal to or below the upper surface of the fin mask layer 50 on the upper surface isolation insulating layer 30, as shown in FIGS. 8A-8C.

In some embodiments, the recess 25 is formed separately for an n-type FET and a p-type FET In some embodiments, the recess 25 (and the subsequent epitaxial layer) for an n-type FET is first formed while the region for a p-type FET is covered by a cover layer (e.g., silicon nitride), and then the recess 25 (and the subsequent epitaxial layer) for the p-type FET is formed while the region for the n-type FET is covered by a cover layer (see, at S113 and S114 of FIG. 1).

Figure 8C:
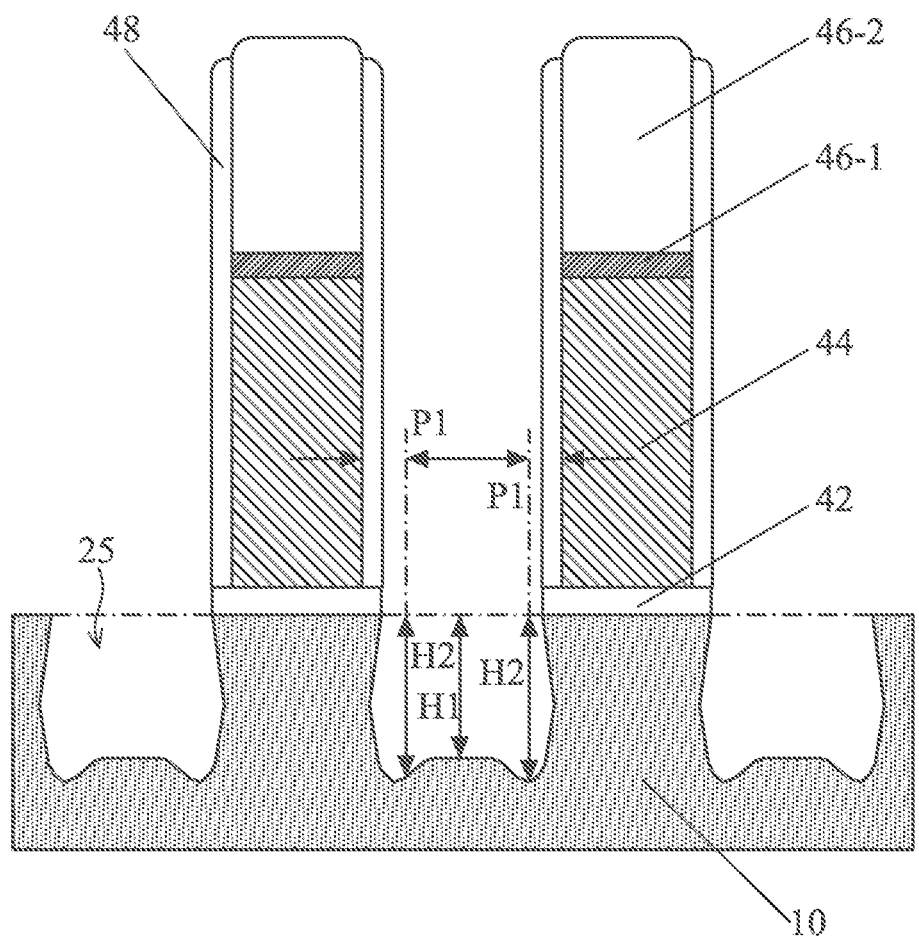

In some embodiments, the top of the recessed fin structure 20 (the bottom of the recess 25) has a W-shape or a wavy shape (may be collectively referred to as a de-footing shape), as shown in FIGS. 8B and 8C, which are a cross sectional view along the gate extension direction (X) In the W-shape, the depth of the recess increases, has a first bottom, decreases, has a local peak, increases, has a second bottom, and decreases, from one edge to another edge along the Y direction. In some embodiments, the cross section of the recess 25 along the X direction also has a W-shape. In other embodiments, the cross section of the recess 25 along the X direction has a U-shape having rounded corners.

As shown in FIGS. 8B and 8C, the W-shaped recess 25 has two bottom (deep) portions and a center (shallow) portion disposed between the two bottom portions and having a shallower depth then the two bottom portions. In some embodiments, the bottom portions are located at a distance P1 measured laterally from a side face of the gate sidewall spacer 48 toward the adjacent sacrificial gate structure, as shown in FIG. 8C. In other embodiments, the bottom of the recess 25 has a wavy shape three or more bottoms having the same or different depths. In some embodiments, the distance P1 is in a range from about 5 nm to about 10 nm, and is in a range from about 7 nm to about 8 nm in other embodiments. In some embodiments, the two bottom portions have the substantially the same depth (difference is less than 0.5 nm), and in other embodiments, one of the bottom portion is deeper than the other. In some embodiments, the depth H2 of the bottom portions is in a range from about 45 nm to about 65 nm and is in a range from about 50 nm to about 60 nm in other embodiments, depending on the design and process requirements. In some embodiments, the depth H1 of the center portion (shallowest portion between the two bottom portions) is smaller than the depth H2, and is in a range from about 50 nm to about 70 nm and is in a range from about 55 nm to about 65 nm in other embodiments, depending on the design and process requirements. In some embodiments, the ratio H1/H2 is in a range from about 0.85 to 0.95.

In some embodiments, as shown in FIG. 8B, the recess 25 laterally penetrates a portion of the fin structure under the sidewall spacer 48. The penetration amount P2 is in a range from about 10% to about 90% of the thickness of the sidewall spacer 48. In other embodiments, the recess extends laterally toward under a portion of the dummy gate electrode 44. The penetration amount P2 is in a range from about 10% to about 90% of the thickness of the sidewall spacer 48. The penetration amount P2 defines a proximity of the recess 25 (source/drain epitaxial layer subsequently formed) to the gate electrode, which is set according to required device performances.

In some embodiments, when another sacrificial gate structure 40 is disposed over the fin structure 20, a portion of the fin structure 20 from one gate structure to another gate structure is recessed as shown in FIG. 8B. In other embodiments, one end (e.g., right end in FIG. 8B) of the recess 25 is defined by the isolation insulating layer 30. Accordingly, the dimension of the recess at this end is defined by a self-aligned manner. In some embodiments, an undercut portion is formed which will help epitaxial growth of a source/drain epitaxial layer.

Figure 19:
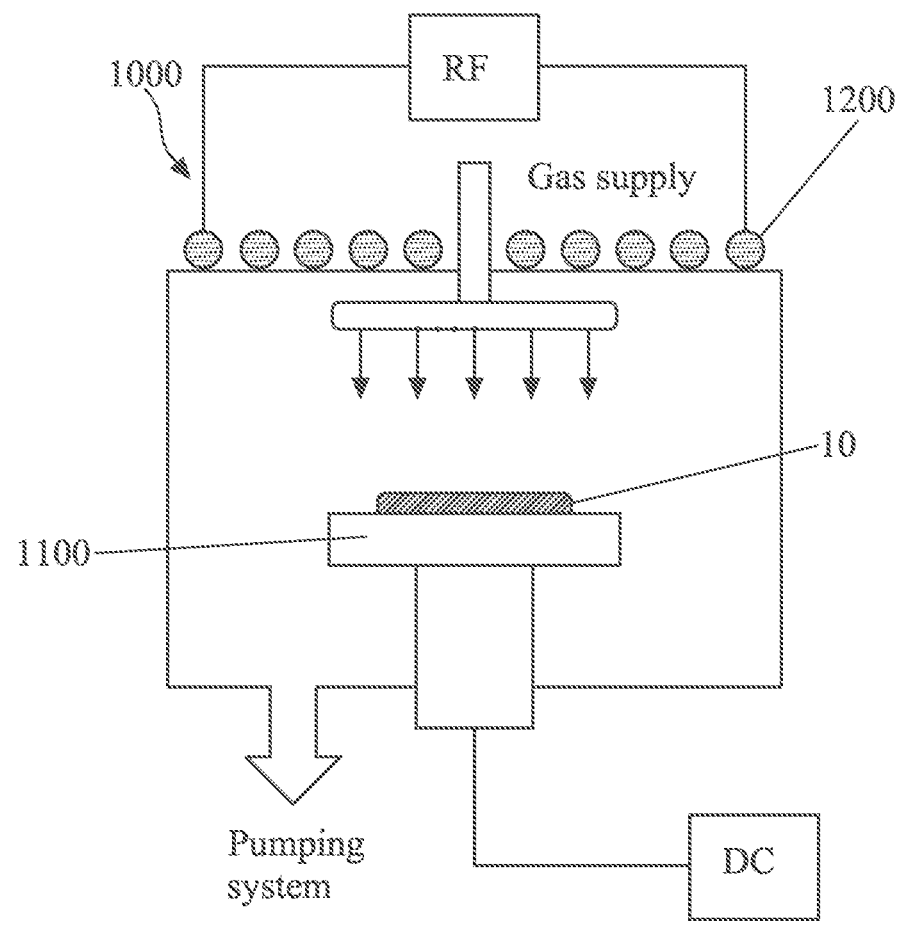
FIG. 19 shows a schematic view of an etching apparatus according to an embodiment of the present disclosure.

The fin structures 20 are recessed to form the W-shaped bottom by using an asymmetric pulsed-bias etching operation using a plasma etching apparatus 1000 shown in FIG. 19. FIGS. 9A-9D show pulsed-bias etching operations according to embodiments of the present disclosure. In some embodiments, the substrate 10 is placed on a wafer stage 1100 of an etching chamber, and the substrate 10 and/or the wafer stage 1100 is biased with, for example, DC voltage. RF power/transformer coupled plasma (TCP) power) is applied to a counter electrode 1200 which is a coil disposed over or around the etching chamber in some embodiments.

Figures 9C, 9D:
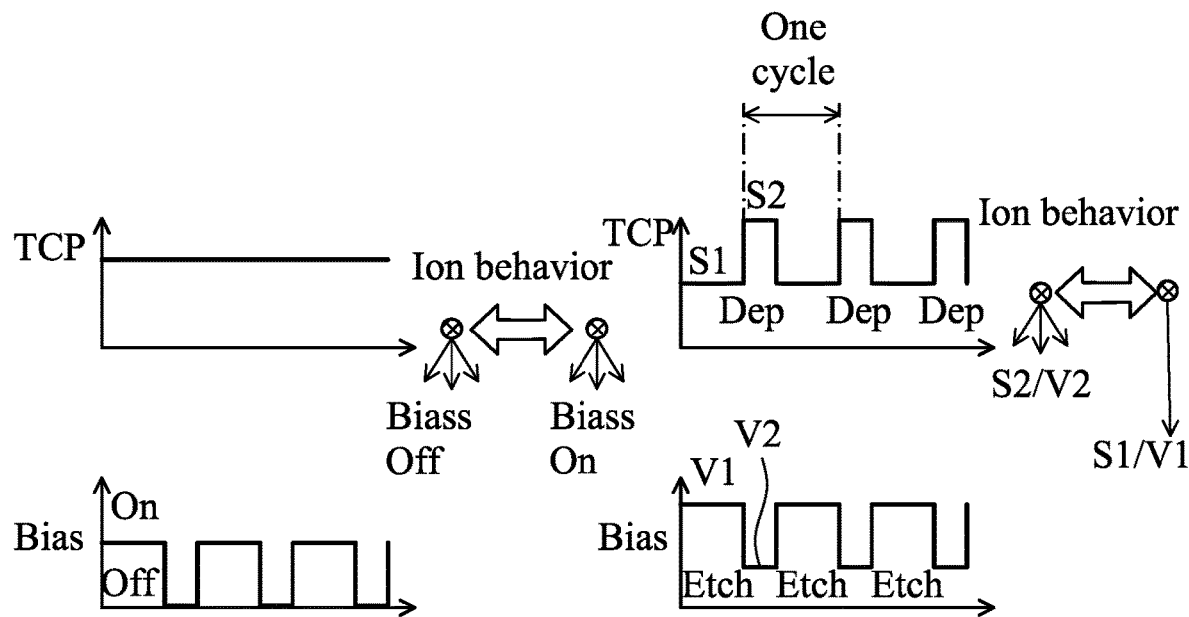
FIGS. 9A, 9B, 9C, 9D and 9E show etching operations for a manufacturing operation for a semiconductor device according to embodiments of the present disclosure.
Figures 9A, 9B:
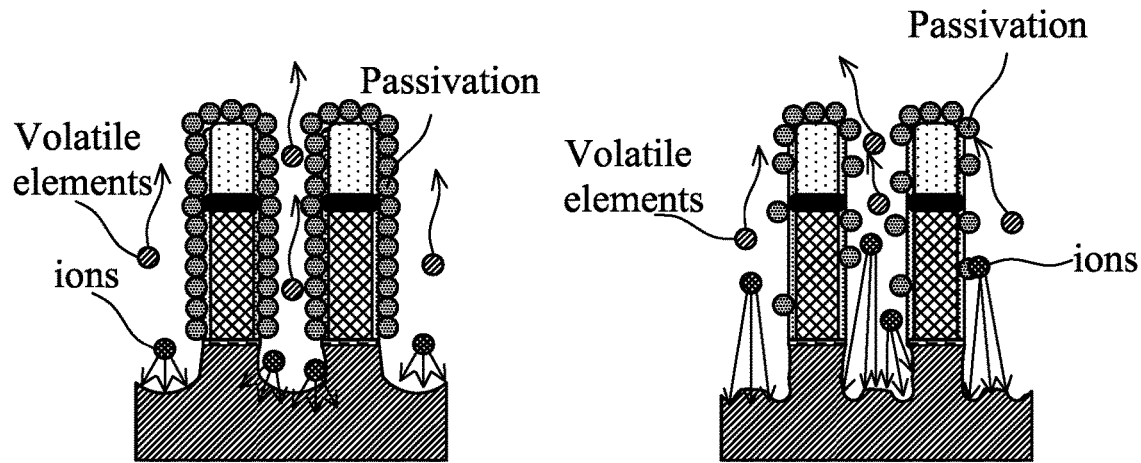

During a plasma etching operation, a DC bias voltage is applied to a wafer stage 1100 and an RF power is applied to a TCP electrode. In a TCP plasma, a coil electrode 1200 is placed over or around a plasma etching chamber and an RF power is applied to the coil electrode 1200. In a pulsing bias method, the bias voltage is applied as a pulse as shown in FIG. 9A and FIG. 9C, while the power of the RF voltage is constant. In an asymmetric pulsing bias method, the bias voltage is applied as a pulse as shown in FIG. 9B and FIG. 9D, while the power of the RF voltage is also changed by applying pulses. As shown in FIG. 9B and FIG. 9D, when the bias voltage is high or on, the power of the RF voltage is low (S1) and when the bias voltage is low or off, the power of the RF voltage is high (S2) in some embodiments. In the asymmetric pulsing bias method, more energized species (ions) having vertical directional movement are generated due to the large potential difference between the RF voltage S2 and the bias voltage V2, while a passivation effect is less, compared with the pulsing bias method. When the potential difference between the RF voltage and the bias voltage is small (S1/V1 condition), similar to FIG. 9A and FIG. 9C, the ion species have less energy with less vertical directional movement, and when the potential difference between the RF voltage and the bias voltage is large (S2/V2 condition), as shown in FIG. 9B and FIG. 9D, the ion species have more energy with more vertical directional movement. The plasma dry etching produces by-product generated from the etching gas and the etched elements. Some of the by-products are volatile and removed by vacuum pumping, and some of the by-products are deposited on the surface of the structures as passivation to protect the structure from etching. When the higher energy ion species are generated more as shown in FIG. 9B and FIG. 9D, the deposition of the passivation layer is suppressed or the deposited passivation layer is etched. By controlling one or more parameters of the pulsed bias voltage and the pulsed RF voltage, it is possible to control deposition of the by-products and etching, and to obtain desired profiled of the recess 25.

Figure 9E:
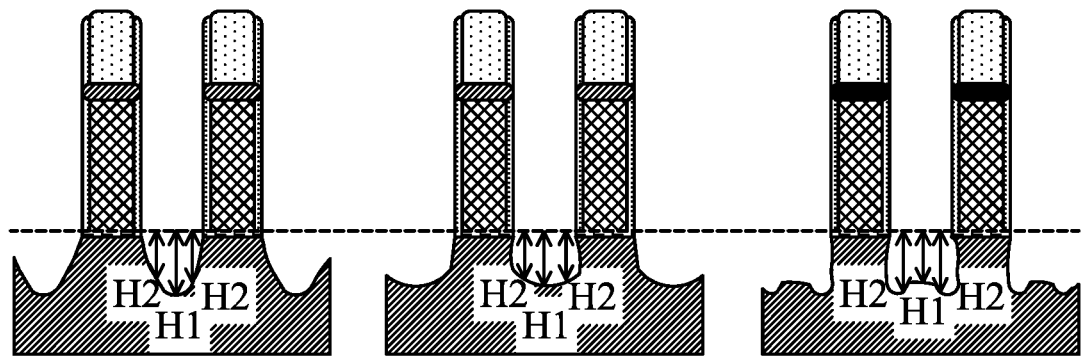

FIG. 9E shows various conditions of asymmetric pulsing bias plasma etching operations and resultant structures according to embodiments of the present disclosure. In some embodiments, a high (or on) value of the DC pulse bias voltage (V1) is in a range from about 200 V to about 400 V, and a low value of the DC pulse bias voltage (V2) is in a range from about 100 V to 150 V. If V1 is too high, the mask layer may be damaged. In some embodiments, the low value of the DC pulse bias is zero (off). In some embodiments, a low value of the power of RF voltage (S1) is in a range from about 300 W to about 500 W, and a high value of the power of RF voltage (S2) is in a range from about 1000 W to 1500 W. One cycle (unit cycle) of the asymmetric pulse bias etching is in a range from about 0.5 sec to about 20 sec in some embodiments and is in a range from about 5 sec to about 15 sec in other embodiments. A duty ratio (on/high-to-off/low ratio) of the RF power pulse is in a range from about 10% to about 30% in one embodiments (Condition 1), is in a range from about 40% to 60% in another embodiment (Condition 2), and is in a range from about 70% to about 90% in other embodiments (Condition 3) The duty ratio can be any range of two values among 5%. 10%, 20%, 30%, 40%, 50%, 60%, 70%, 80% and 90%. In some embodiments, the duty ratio changes during the etching. For example, the duty ratio is repeatedly changed from a low value (e.g., 5% to 40%) and a high value (e.g., 70% to 90%). In some embodiments, the duty ratios of the bias voltage and the RF voltage are the same. In other embodiments, the duty ratios of the bias voltage and the RF voltage are different from each other. In some embodiments, the pulse of the bias voltage is synchronous with the pulse of the RF voltage. In other embodiments, the phase of the pulses of the bias voltage is shifted from the phase of the pluses of the RF voltage. In some embodiments, the phase difference is about 10% to about 50% of the one cycle of the pulsed bias voltage. By adjusting the phase difference, it is possible to control amount of ion species having more vertical momentum. The frequency of on/off or low/high of the DC bias and/or the RF power is in a range from about 10 Hz to about 1 kHz in some embodiments, and is in a range from about 100 Hz to about 500 Hz in other embodiments. In some embodiments, the frequency of the DC bias voltage is equal to the frequency of the pulsed RF voltage, and in other embodiments, the frequency of the DC bias voltage is different from the frequency of the pulsed RF voltage A pressure during the asymmetric pulse bias etching is in a range from about 1 mTorr to about 100 mTorr in some embodiments, and is in a range from about 10 mTorr to about 50 mTorr in other embodiments.

In some embodiments, the asymmetric pulsed-bias etching is a repetition of etching and deposition operations During the "on" period, the fin structures are etched and during the "off" period, the rate of deposition of by-products is greater than the etching rate. As shown in FIGS. 9B, 9D and 9E, when the duty ratio increases, the number of the vertical ions (low angle ions) increases.

In some embodiments, the etching gas includes a halogen containing gas, such as HBr. In some embodiments, HBr is diluted with an inert gas, such as He and/or Ar. In some embodiments, a flow ratio of HBr to the dilution gas is in a range from about 0.3 to about 0.7, and in other embodiments, the flow ratio is in a range from about 0.4 to about 0.6.

In some embodiments, by adjusting the etching conditions, for example, an over-etching time, the fin mask layer 50 remains on the upper surface of the isolation insulating layer 30. The thickness of the remaining fin mask layer 50 is in a range from about 2 nm to about 10 nm in some embodiments.

In some embodiments, the semiconductor device includes a memory area (e.g., static random access memory (SRAM)) and a logic circuit area. Generally, pattern density of the memory area is greater than pattern density of the logic circuit area. When the pattern densities are different among areas, micro-loading effect in plasma dry etching prevents simultaneous etching of the dense areas and coarse areas, and thus two or more etching operations (which also require one or more lithography operations) are necessary. The asymmetric pulsed-bias etching operation as set forth above can reduce the influence of the micro-loading effect and thus makes it possible to dry-etch the dense areas and the coarse areas at the same time.

In some embodiments, at S108 of FIG. 1, a cleaning operation is performed. In some embodiments, the cleaning operation includes wet cleaning using a heated acid solution (mixture of $H_2SO_4$ and $H_2O_2$) to remove byproduct of the etching operation.

Figure 10A:
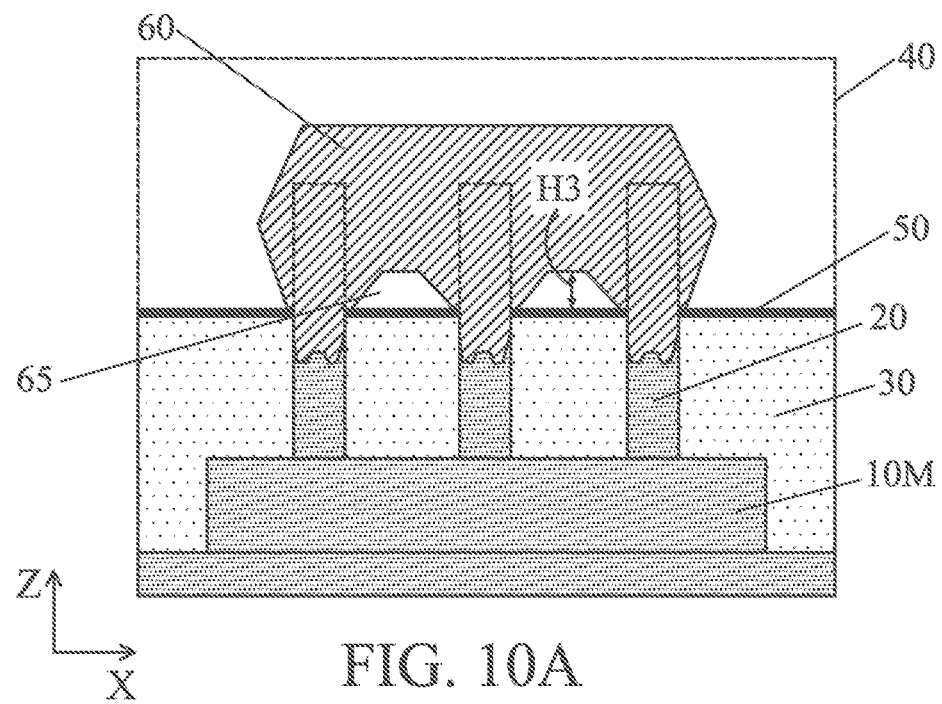
Figure 10B:
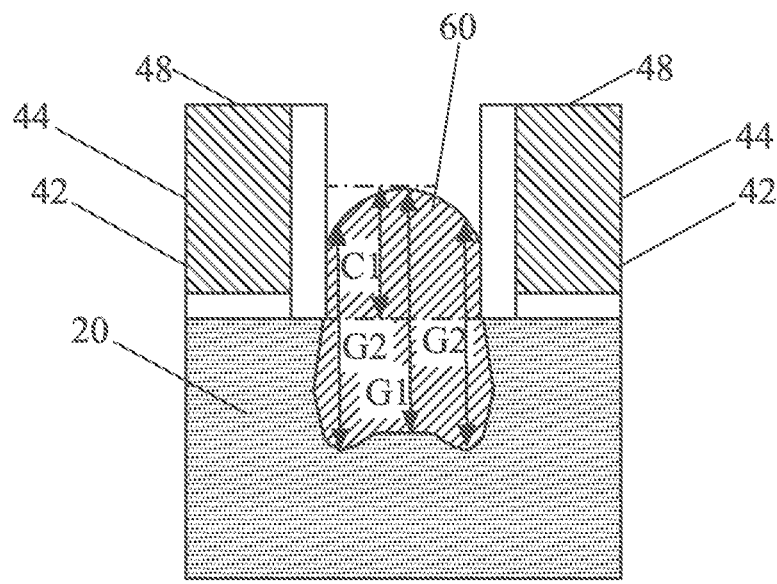

Then, at S109 of FIG. 1, as shown in FIGS. 10A and 10B, an epitaxial source/drain structure 60 for an n-type FET is formed over the recessed fin structures 20. The epitaxial source/drain structure 60 is made of one or more layers of semiconductor material having a different lattice constant than the fin structures 20 (channel regions) When the fin structures are made of Si, the epitaxial source/drain structure 60 includes SiP, SiC or SiCP for an n-channel Fin FET The epitaxial source/drain structure 60 is epitaxially formed over the upper portions of the recessed fin structures.

The source/drain epitaxial layer 60 may be grown at a temperature of about 600 to 800° C. under a pressure of about 80 to 150 Torr, by using a Si containing gas, such as $SiH_4$, $Si_2H_6$ or $SiCl_2H_2$; a C containing gas, such as $CH_4$ or $C_2H_6$; and/or a dopant gas, such as $PH_3$. As set forth above, the source/drain structure for an n-channel FET and the source/drain structure for a p-channel FET may be formed by separate epitaxial processes.

Due to the relatively small space between the fin structures and the fin mask layer 50 remaining on the upper surface of the isolation insulating layer between the fin structures and the recessed fin structures 20, the adjacent epitaxial source/drain structures formed over each of the first fin structures 20 are merged such that a void or a gap tan air gap) 65 is formed by the merged second epitaxial source/drain structure 60 and the fin mask layer 50 on the upper surface of the isolation insulating layer 30, as shown in FIG. 10A.

In particular, due to the fin mask layer 50 on the upper surface of the isolation insulating layer 30, the height H3 of the void 65 is larger than the case where no fin mask layer 50 remains on the upper surface of the isolation insulating layer 30. In some embodiments, the height H3 of the void is in a range from about 10 nm to about 30 nm measured from the upper surface of fin mask layer 50, and in a range from about 15 nm to about 25 nm in other embodiments. In addition, due to the remaining fin mask layer 50, the isolation insulating layer 30 is protected during the fin etching.

After the epitaxial layer for an n-type FET is formed, the fin sidewall is removed in some embodiments, at S110 of FIG. 1. In some embodiments, the cover layer covering the p-type region is also removed at S110 of FIG. 1, followed by a cleaning operation at S111 of FIG. 1.

Then, similar to the operation of S106, at S112 of FIG. 1, a fin sidewall for a p-type FET is formed, and then at S113 of FIG. 1, a recess is formed in the source/drain region of the fin structure for a p-type FET. The process for making the recess for a p-type FET is the same as or similar to the process for making the recess 22 for the n-type FET. At S114 of FIG. 1, a cleaning operation similar to that of S108 is performed.

Figure 10C:
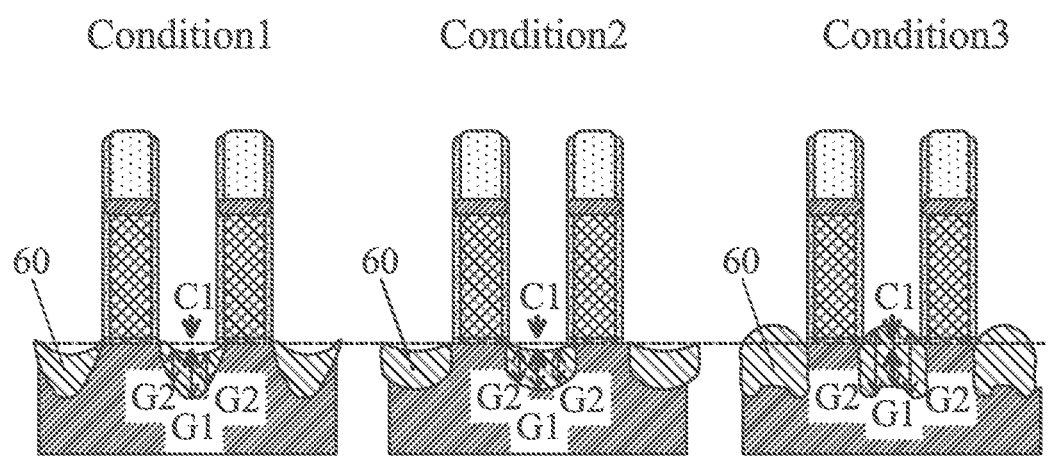

Then, at S115 of FIG. 1, an epitaxial source/drain structure for a p-type FET is formed over the recessed fin structures 20. The epitaxial source/drain structure is made of one or more layers of semiconductor material having a different lattice constant than the fin structures 20 (channel regions). When the fin structures are made of Si, the epitaxial source/drain structure includes SiGe or Ge for a p-channel Fin FET. The epitaxial source/drain structure is epitaxially formed over the upper portions of the recessed fin structures. The source/drain epitaxial layer may be grown at a temperature of about 600 to 800° C. under a pressure of about 80 to 150 Torr, by using a Si containing gas, such as $SiH_4$, $Si_2H_6$ or $SiCl_2H_2$; and a Ge containing gas, such as $GeH_4$, $Ge_2H_6$ or $GeCl_2H_2$. In some embodiments, the source/drain epitaxial layer further includes boron. The structures shown in FIGS. 10A-10D and FIGS. 11-18 can be applied to the p-type FET FIGS. 10C and 10D shows cross sectional views of the epitaxial layers grown over the recesses formed by various conditions of plasma etching operations according to embodiments of the present disclosure. In some embodiments, when the source/drain epitaxial layer 60 is formed over the W-shaped recess, the epitaxial layer 60 can have a higher volume compared with the cases where the recess has a V-shape or a U-shape. In FIG. 10C, the heights G1 and G2 correspond to the depth H1 and H2 shown in FIGS. 8B and 8C The height C1 is a height of the top of the epitaxial layer 60 measured from the upper surface of the fin structure 20 (interface between the fin structure and the sacrificial gate dielectric layer) In some embodiments, the height G1 at the center portion is in a range from about 50 nm to about 70 nm and is in a range from about 55 nm to about 65 nm in other embodiments, depending on the design and process requirements. In some embodiments, the height G2 over the deep bottom portions is in a range from about 50 nm to about 70 nm and is in a range from about 55 nm to about 65 nm in other embodiments, depending on the design and process requirements. In some embodiments, the ratio G1/G2 is in a range from about 0.9 to 1.05 and is in a range from about 0.92 to 1.01 in other embodiments. In some embodiments the height C1 is in a range from about 0.2 nm to about 7 nm, and is in a range from about 0.3 nm to about 5 nm in other embodiments.

Figure 11:
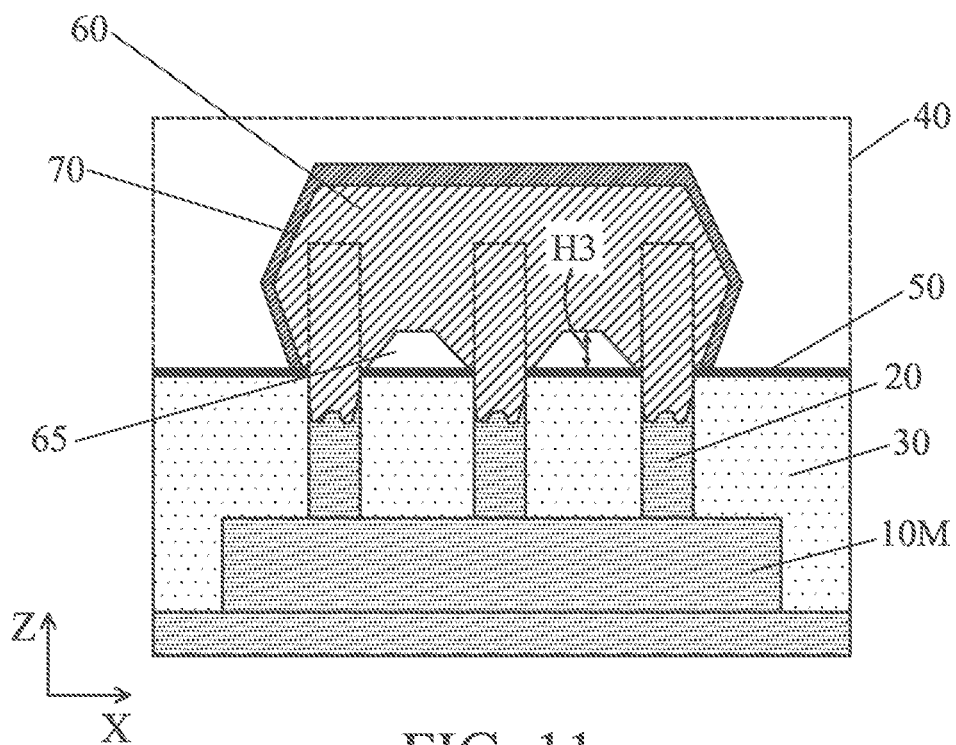
FIG. 11 shows a cross sectional view of one of the various stages of a manufacturing operation for a semiconductor device according to an embodiment of the present disclosure.

In some embodiments, at S116 of FIG. 1, after the epitaxial source/drain structure 60 is formed, as shown in FIG. 11, a silicide layer 70 is formed over the epitaxial source/drain structure 60 in some embodiments A metal material, such as Ni, Ti, Ta and/or W, is formed over the epitaxial source/drain structure 60, and an annealing operation is performed to form a silicide layer 70. In other embodiments, a silicide material, such as NiSi, TiSi, TaSi and/or WSi, is formed over the epitaxial source/drain structure 60, and an annealing operation may be performed. The annealing operation is performed at a temperature of about 250° C. to about 850° C. The metal material or the silicide material is formed by CVD or ALD. The thickness of the silicide layer 70 is in a range from about 4 nm to about 10 nm in some embodiments Before or after the annealing operations, the metal material or the silicide material formed over the isolation insulating layer 30 is selectively removed.

Figure 12:
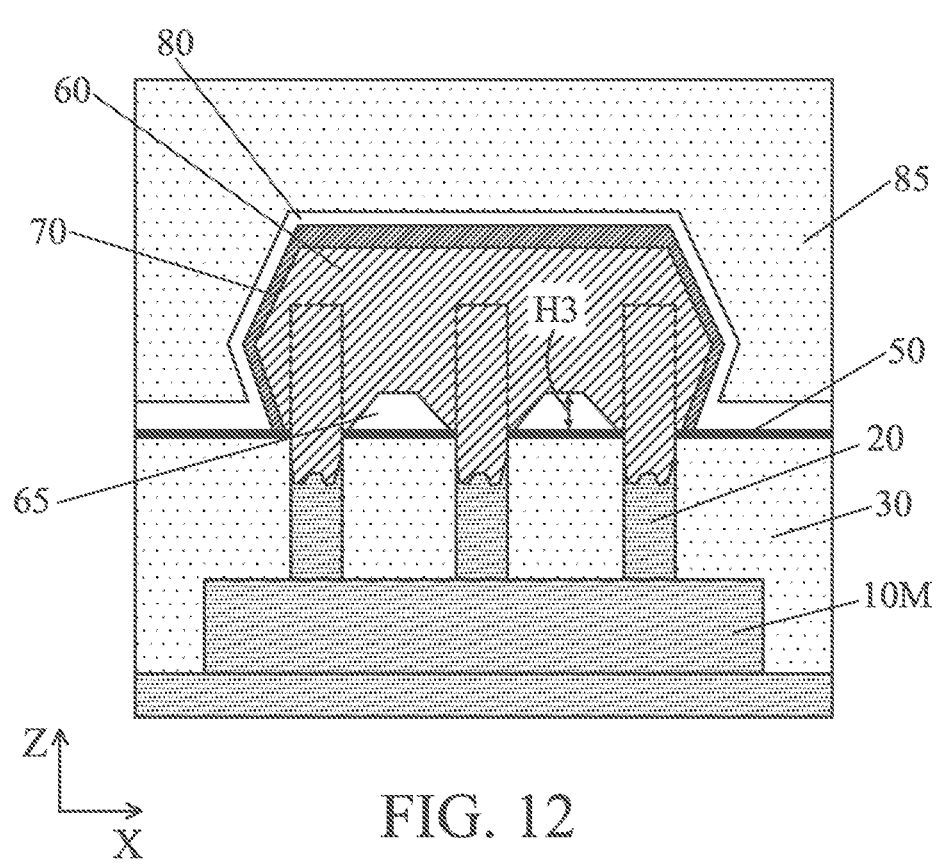
FIG. 12 shows a cross sectional view of one of the various stages of a manufacturing operation for a semiconductor device according to an embodiment of the present disclosure.

Then, at S117 of FIG. 1, as shown in FIG. 12, an insulating layer 80, functioning as a contact etching stop layer, is formed over the metal gate structure and the source/drain structures 60, and then an interlayer dielectric layer 85 is formed. The insulating layer 80 is one or more layers of insulating material. In one embodiment, the insulating layer 80 is made of silicon nitride formed by CVD. The materials for the interlayer dielectric layer 85 include compounds comprising Si, O, C and/or H, such as silicon oxide, SiCOH and SiOC Organic materials, such as polymers, may be used for the interlayer dielectric layer 85.

Figure 13:
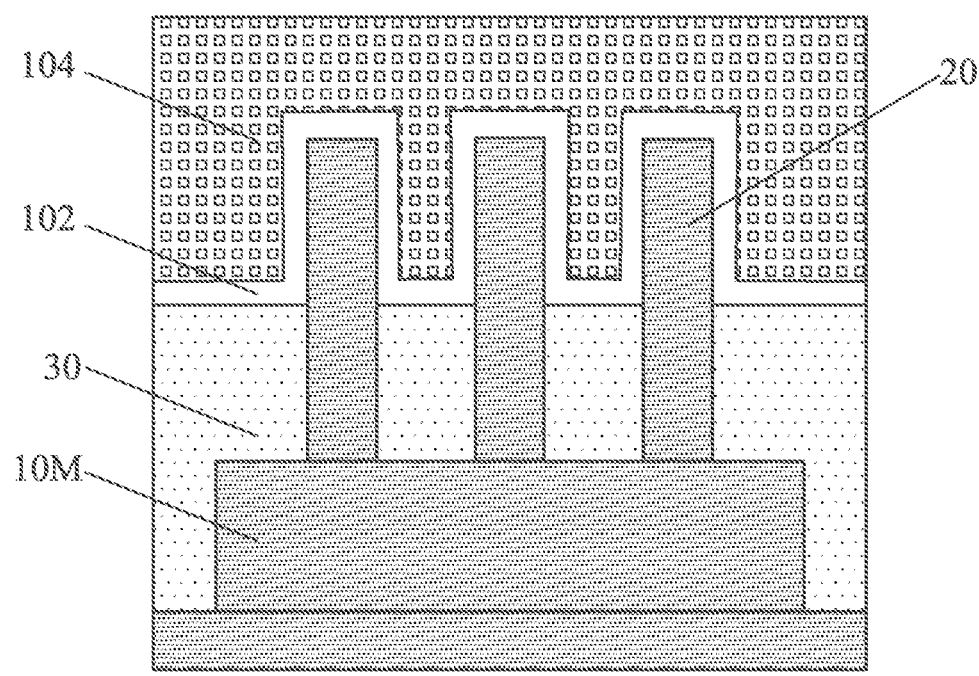
FIG. 13 shows a cross sectional view of one of the various stages of a manufacturing operation for a semiconductor device according to an embodiment of the present disclosure.

Then, at S118 of FIG. 1, a metal gate structure is formed by using a gate replacement technology. After forming the interlayer dielectric layer 85, a CMP operation is performed to expose the dummy gate electrode 44. The dummy gate structures (dummy gate electrode 44 and dummy gate dielectric layer 42) are then removed and replaced with a metal gate structures (metal gate electrode and gate dielectric layer). FIG. 13 shows a cross sectional view cutting the gate structure.

The dummy gate electrode 44 and the dummy gate dielectric layer 42 are removed, by appropriate etching processes, respectively, to form a gate opening. Metal gate structures including a gate dielectric layer 102 and metal gate electrode 104 are formed in the gate openings.

The gate dielectric layer 102 is formed over an interface layer (not shown) disposed over the channel layer of the fin structures 20 in some embodiments. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer 102 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode 104 is formed over the gate dielectric layer. The metal gate electrode 104 includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) are interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN. TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations, such as CMP, are performed.

After the metal gate structure is formed, one or more interlayer dielectric layer is formed over the metal gate structure and the interlayer dielectric layer 85. The interlayer dielectric layers are collectively referred to as interlayer dielectric layer 86 as shown in FIG. 14.

Figure 14:
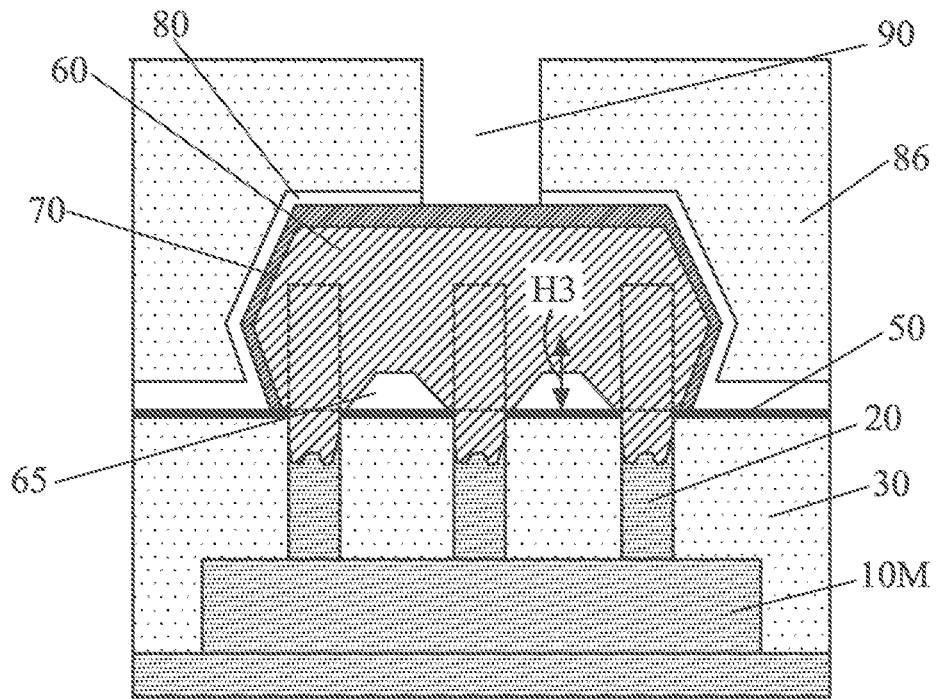
FIG. 14 shows a cross sectional view of one of the various stages of a manufacturing operation for a semiconductor device according to an embodiment of the present disclosure.

At S119 of FIG. 1, by using a patterning operation including lithography, a contact hole 90 is formed in the interlayer dielectric layer 86 and the insulating layer 80 so as to expose the epitaxial source and drain structures 60 with the silicide layer 70, as shown in FIG. 14.

Figure 15:
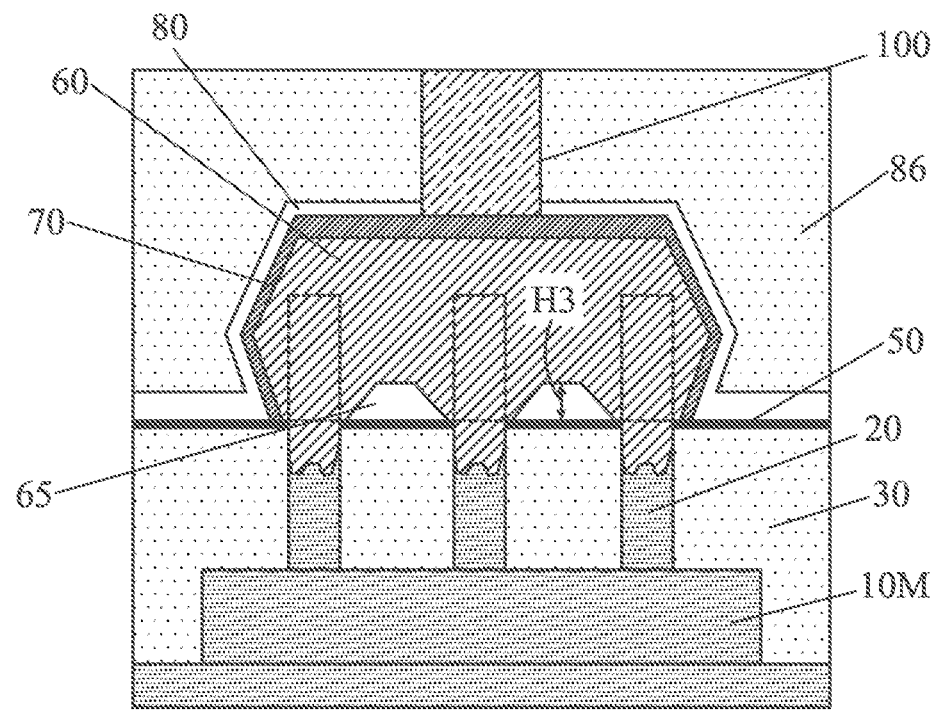
FIG. 15 shows a cross sectional view of one of the various stages of a manufacturing operation for a semiconductor device according to an embodiment of the present disclosure.

Then, the contact hole is filled with a conductive material, thereby forming a contact plug 100, as shown in FIG. 15. The contact plug 100 may include a single layer or multiple layers of any suitable metal such as Co, W, Ti, Ta, Cu, Al and/or Ni and/or nitride thereof.

After forming the contact plug, further CMOS processes are performed to form various features such as additional interlayer dielectric layer, contacts/vias, interconnect metal layers, and passivation layers, etc.

In some embodiments, the silicide layer 70 is formed after the contact hole 90 is opened. In such a case, after forming the epitaxial source/drain structure 60 as shown in FIGS. 10A and 10B, the metal gate structures, the insulating layer 80 (contact etching stop layer) and the interlayer dielectric layer 86 are formed, without forming a silicide layer. Then, a contact hole is formed in the insulating layer 80 and the interlayer dielectric layer 86 to expose the upper surface of the epitaxial source/drain structure 60, and then a silicide layer is formed on the upper surface of the epitaxial source/drain structure 60. After forming the silicide layer, the conductive material is formed in the contact hole, thereby forming a contact plug.

Figure 16:
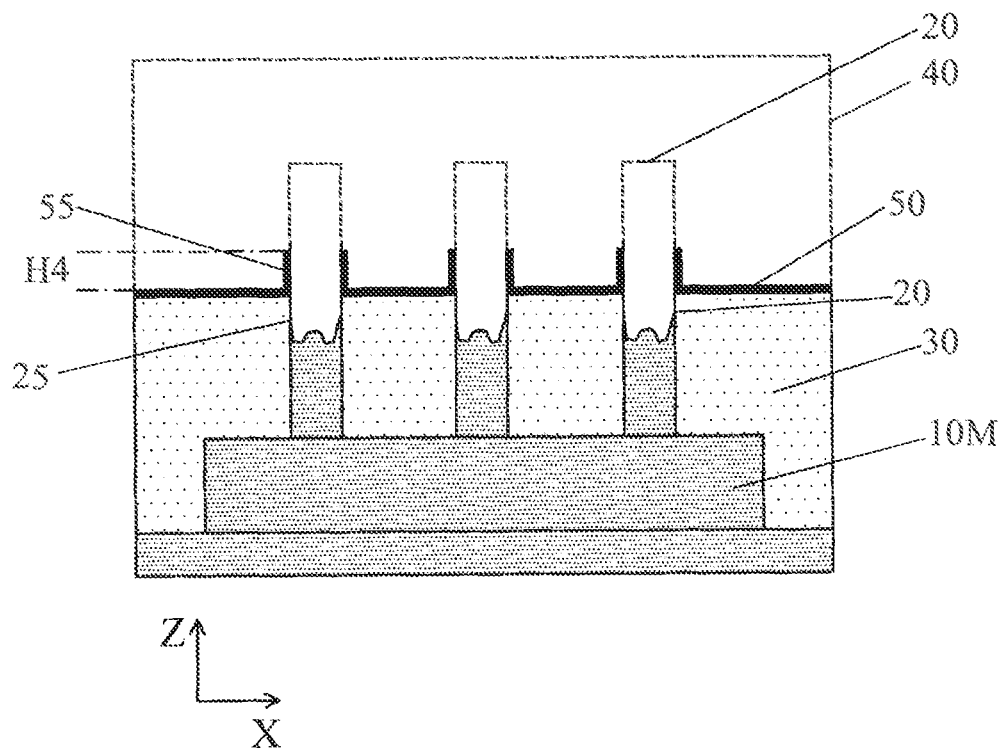
FIG. 16 shows a cross sectional view of one of the various stages of a manufacturing operation for a semiconductor device according to an embodiment of the present disclosure.
Figure 17:
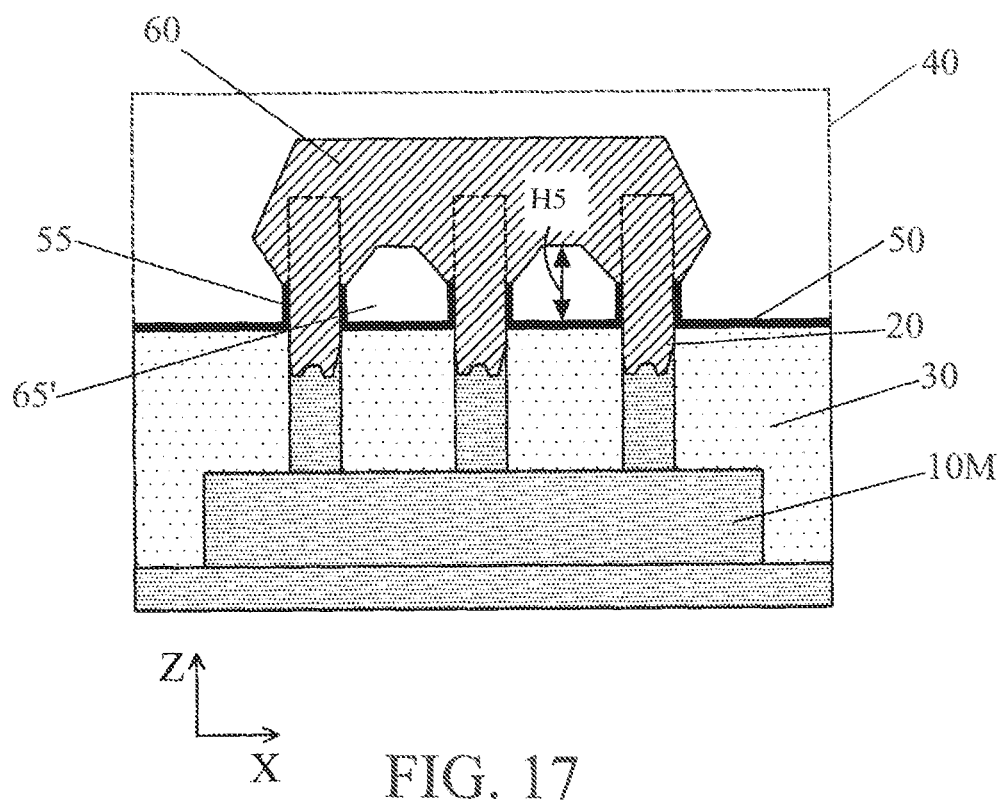
FIG. 17 shows a cross sectional view of one of the various stages of a manufacturing operation for a semiconductor device according to an embodiment of the present disclosure.

FIGS. 16 and 17 show exemplary cross sectional views of various stages for manufacturing a Fin FET device according to another embodiment of the present disclosure. Materials, configurations, dimensions, processes and/or operations same as or similar to those described with the foregoing embodiments may be employed in the following embodiments and the detailed explanation may be omitted.

During the recess etching of the fin mask layer 50 and the fin structures 20 described with respect to FIGS. 8A and 8B, some lower portions of the fin mask layer 50 disposed on sidewall of the fin structures 20 remain without being etched away thereby forming sleeve-like portions 55, as show in FIG. 16. The height H4 of the sleeve-like portions 55 is in a range from about 1 nm to about 10 nm in some embodiments.

Then, similar to FIG. 8A, the epitaxial source/drain structure 60 is formed, thereby forming voids 65', as shown in FIG. 17. Due to the sleeve-like portions 55, the height H5 of the voids 65' in this embodiment is greater than the height H3 in FIG. 10A. The height H5 is in a range from about 20 nm to about 35 nm in some embodiments.

In the present disclosure, since a void is formed between the source/drain epitaxial layer and the isolation insulating layer (STI), a parasitic capacitance at the source/drain structure can be reduced. Further, by letting the fin mask layer (e.g., SiN) remain on the upper surface of the isolation insulating layer, the height (dimension) of the void can be larger.

Figure 18:
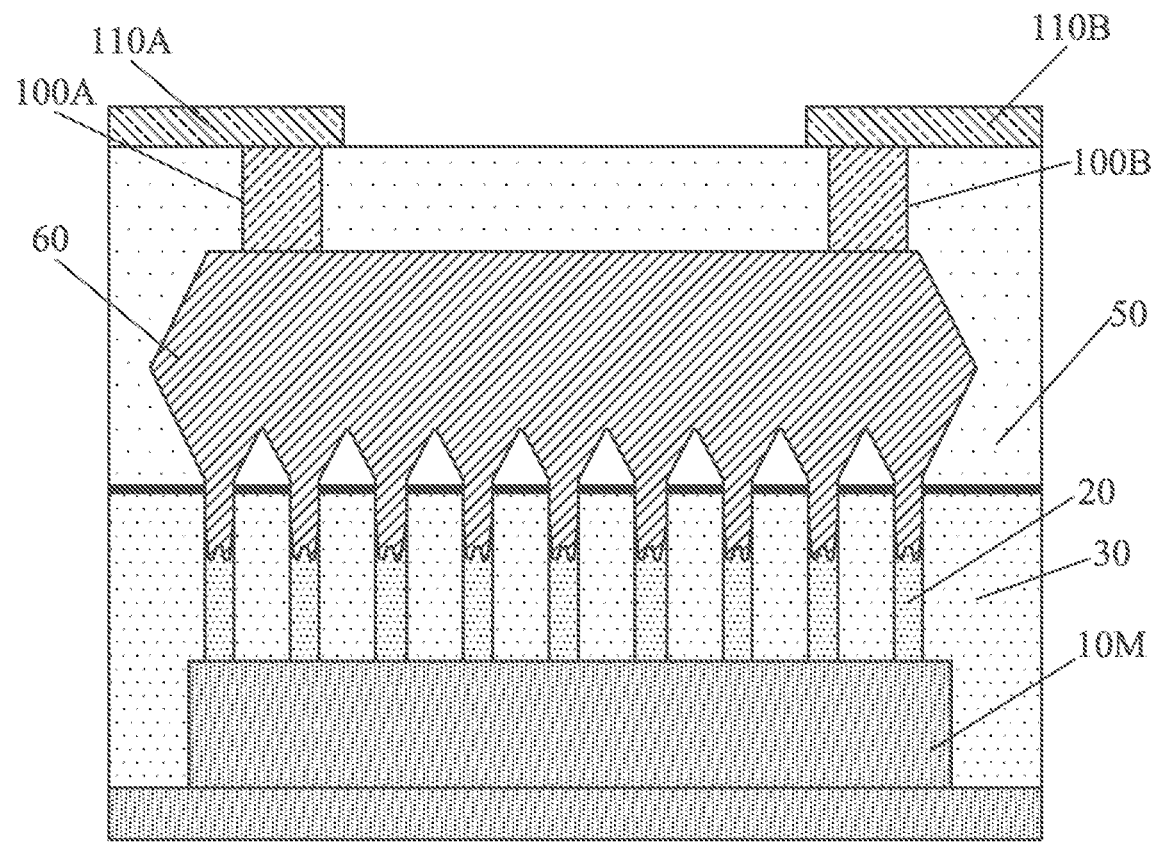
FIG. 18 shows a cross sectional view of a semiconductor device according to an embodiment of the present disclosure.

FIG. 18 shows a cross sectional view of a semiconductor device according to an embodiment of the present disclosure. Materials, configurations, dimensions, processes and/or operations same as or similar to those described with the foregoing embodiments may be employed in the following embodiments and the detailed explanation may be omitted.

As shown in FIG. 18, a plurality of fin structures 20, for example, 5 to 20 (e.g., 9) fin structures 20, are disposed over the substrate 10, and the merged source/drain epitaxial structure 60 is formed over the fin structures. In FIG. 18, an etch stop layer is omitted. As set forth above, the source/drain epitaxial layer 60 is grown from the rounded corner shape of the recessed fin structures. The rounded corner shape affects the growth of the source/drain epitaxial layer in such a manner that the epitaxial layers are more likely to merge and form the merged epitaxial structure. In some embodiments, the upper surface of the merged epitaxial layer has an uneven surface and the peak-to-valley value of the upper surface of the merged epitaxial layer in the X direction is in a range from about 5 nm to about 20 nm, and is in a range from about 7 nm to about 15 nm in other embodiments. The peak-to-valley value is measured between a portion above the second fin structure from the left and a portion above the second fin structure from the right.

In some embodiments, as shown in FIG. 18, the merged source/drain epitaxial layer 60 is electrically coupled to a circuit element via a contact plug 100A and a metal wiring 110A and to a different circuit element via a contact plug 100B and a metal wiring 110B. In such a case, two or more gate electrodes are disposed over the plurality of fin structures in some embodiments.

In the embodiments of the present disclosure, by forming a W-shaped recess by using asymmetric pulse bias etching, it is possible to improve properties of the source/drain epitaxial layer. The asymmetric pulse bias etching controls shapes of the recess, which in turn controls the shape of the source/drain epitaxial layer (e.g., a bottom profile). The epitaxial layer volume and topography are optimized, which further improves the contact area between the epitaxial layer to a source/drain contact (e.g., a TiN barrier layer) to control the device mobility.

It wall be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a Fin FET, a fin structure is formed over a substrate. The fin structure extends in a first direction in plan view. An isolation insulating layer is formed over the substrate so that a lower portion of the fin structure is embedded in the isolation insulating layer and an upper portion of the fin structure is exposed from the isolation insulating layer. A gate structure is formed over a part of the fin structure, the gate structure extending in a second direction crossing the first direction in plan view. A fin mask layer is formed on sidewalls of the fin structure protruding from the isolation insulating layer and not covered by the gate structure, and on an upper surface of the isolation insulating layer. By a plasma etching process, a source/drain region of the fin structure is recessed to form a recess. An epitaxial source/drain structure is formed over the recess in the fin structure. The plasma etching process comprises applying pulsed bias voltage and RF voltage with pulsed power. In one or more of the foregoing and following embodiments, when the pulsed bias voltage is high, the pulsed power is low. In one or more of the foregoing and following embodiments, the pulsed bias voltage and the pulsed power comprise a duty ratio in a range from 70% to 90%. In one or more of the foregoing and following embodiments, the pulsed bias voltage comprises a high voltage in a range from 300 V to 500 V and a low voltage in a range from 100 V to 150 V. In one or more of the foregoing and following embodiments, the RF voltage comprises a high input power in a range from 1000 W to 1500 W and a low input power in a range from 300 W to 500 W. In one or more of the foregoing and following embodiments, the plasma etching process comprises supplying HBr and He gases. In one or more of the foregoing and following embodiments, a flow ratio of the HBr gas and the He gas is in a range from 0.3 to 0.7 In one or more of the foregoing and following embodiments, the plasma etching process is performed under a pressure in a range from 1 mTorr to 100 mTorr. In one or more of the foregoing and following embodiments, a bottom of the recess has a W-shape or a wavy shape. In one or more of the foregoing and following embodiments, one cycle of the pulsed bias voltage and the pulsed power is in a range from 0.5 sec to 20 sec.

In accordance with another aspect of the present application, in a method of manufacturing a semiconductor device including a Fin FET, a plurality of fin structures are formed over a substrate. The plurality of fin structures extend in a first direction and are arranged in a second direction crossing the first direction in plan view. An isolation insulating layer is formed over the substrate so that lower portions of the plurality of fin structures are embedded in the isolation insulating layer and upper portions of the plurality of fin structures are exposed from the isolation insulating layer. A fin mask layer is formed on sidewalls of source/drain regions of the plurality of fin structures protruding from the isolation insulating layer. The source/drain regions of the plurality of fin structures are recessed to form a recess. An epitaxial source/drain structure is formed over each of the recess of the fin structures to form a merged source/drain epitaxial layer. In the recessing the source/drain regions, a plasma etching process combining etching and deposition processes is used, and the plasma etching process comprises applying pulsed bias voltage and RF voltage with pulsed power. In one or more of the foregoing and following embodiments, depths of the recesses is in a range from 50 nm to 70 nm. In one or more of the foregoing and following embodiments, the depths are not uniform. In one or more of the foregoing and following embodiments, a difference between a maximum depth and a minimum depth is in a range from 0.5 nm to 5 nm. In one or more of the foregoing and following embodiments, a bottom of the recess has a W-shape. In one or more of the foregoing and following embodiments, a number of the plurality of fin structures coupled to the source/drain epitaxial layer is five to twenty. In one or more of the foregoing and following embodiments, when the pulsed bias voltage is high, the pulsed power is low. In one or more of the foregoing and following embodiments, the pulsed bias voltage and the pulsed power comprise a duty ratio in a range from 70% to 90%. In one or more of the foregoing and following embodiments, the pulsed bias voltage comprises a high voltage in a range from 300 V to 500 V and a low voltage in a range from 100 V to 150 V, and the RF voltage comprises a high input power in a range from 1000 W to 1500 W and a low input power in a range from 300 W to 500 W.

In accordance with another aspect of the present disclosure, a semiconductor device includes an isolation insulating layer disposed over a substrate, a plurality of fin structures disposed over the substrate and extending in a first direction in plan view, a gate structure disposed over parts of the plurality of fin structures, and extending in a second direction crossing the first direction, a source/drain epitaxial layer, and a dielectric layer disposed on an upper surface of the isolation insulating layer. The plurality of fin structures not covered by the gate structure are recessed below the upper surface of the isolation insulating layer, the source/drain epitaxial layer is formed over the recessed fin structures, and each of interfaces between the source/drain epitaxial layer and each of the recessed fin structures has a W-shape.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a fin field effect transistor (Fin FET), the method comprising:
   forming a fin structure over a substrate, the fin structure extending in a first direction,
   forming an isolation insulating layer over the substrate so that a lower portion of the fin structure is embedded in the isolation insulating layer and an upper portion of the fin structure is exposed from the isolation insulating layer;
   forming a gate structure over a part of the fin structure, the gate structure extending in a second direction crossing the first direction in plan view;
   recessing, by a plasma etching process, a source/drain region of the fin structure to form a recess; and
   forming an epitaxial source/drain structure over the recess in the fin structure,
   wherein the plasma etching process comprises applying pulsed bias voltage changing between a high voltage and a low voltage lower than the high voltage and RF voltage with pulsed power changing between a high power and a low power lower than the high power, and
   when the pulsed bias voltage is the high voltage, the pulsed power is the low power.

2. The method of claim 1, wherein the low voltage is zero.

3. The method of claim 1, wherein a duty ratio of each of the pulsed bias voltage and the pulsed power is in a range from 70% to 90%.

4. The method of claim 1, wherein the high voltage is in a range from 200 V to 400 V and the low voltage is in a range from 100 V to 150 V.

5. The method of claim 1, wherein the high power is in a range from 1000 W to 1500 W and the low power is in a range from 300 W to 500 W.

6. The method of claim 1, wherein the plasma process comprises supplying HBr gas and one or more noble gases.

7. The method of claim 6, wherein a flow ratio of the HBr gas and the one or more noble gases is in a range from 0.3 to 0.7.

8. The method of claim 1, wherein the plasma process is performed under a pressure in a range from 1 mTorr to 100 mTorr.

9. The method of claim 1, wherein a bottom of the recess has a W-shape or a wavy shape.

10. The method of claim 1, wherein one cycle of the pulsed bias and the pulsed power having one high value time and one low value time is in a range from 0.5 sec to 20 sec.

11. A method of manufacturing a semiconductor device including a fin field effect transistor (Fin FET), the method comprising:

forming a plurality of fin structures over a substrate, the plurality of fin structures extending in a first direction and arranged in a second direction crossing the first direction;

forming an isolation insulating layer over the substrate so that lower portions of the plurality of fin structures are embedded in the isolation insulating layer and upper portions of the plurality of fin structures are exposed from the isolation insulating layer;

recessing the source/drain regions of the plurality of fin structures to form recesses; and forming an epitaxial source/drain structure over each of the recess of the fin structures to form a merged source/drain epitaxial layer, wherein in the recessing the source/drain regions, a plasma process combining etching and deposition processes is used, and a bottom of each of the recesses has a W-shape having two deeper portions and one shallow portion disposed between the two deeper portions, the shallow portion having a smaller depth than the deeper portions.

12. The method of claim 11, wherein a depth of the shallow portion is in a range from 50 nm to 70 nm.

13. The method of claim 11, wherein a difference between a depth at deeper one of the deeper portions and a depth at the shallow portion is in a range from 0.5 nm to 5 nm.

14. The method of claim 11, wherein the plasma etching process comprises applying pulsed bias voltage changing between a high voltage and a low voltage lower than the high voltage and RF voltage with pulsed power changing between a high power and a low power lower than the high power.

15. The method of claim 14, wherein, when the pulsed bias voltage is the high voltage, the pulsed power is the low power.

16. The method of claim 15, wherein a duty ratio of each of the pulsed bias and the pulsed power is in a range from 70% to 90%.

17. The method of claim 16, wherein at least one of the duty ratio of the pulsed bias and the duty ratio of the pulsed power changes during the recessing the source/drain regions.

18. The method of claim 14, wherein:
the high voltage is in a range from 200 V to 400 V and the low voltage is in a range from 100 V to 150 V, and
the high power is in a range from 1000 W to 1500 W and the low power is in a range from 300 W to 500 W.

19. The method of claim 14, wherein a pulse of the pulse bias voltage is synchronous with a pulse of the RF voltage.

20. A semiconductor device comprising:
an isolation insulating layer disposed over a substrate;
a fin structure disposed over the substrate and extending in a first direction in plan view;
a gate structure disposed over a part of the fin structure;
a source/drain epitaxial layer over a source/drain region of the fin structure; and
a dielectric layer disposed on an upper surface of the isolation insulating layer, wherein:
an interface between the source/drain epitaxial layer and the source/drain region of the fin structure has a W-shape having two deeper portions and one shallow portion disposed between the two deeper portions, the shallow portion having a smaller depth than the deeper portions.

* * * * *